(12) United States Patent
Abraham et al.

(10) Patent No.: US 7,960,096 B2
(45) Date of Patent: Jun. 14, 2011

(54) SUBLITHOGRAPHIC PATTERNING METHOD INCORPORATING A SELF-ALIGNED SINGLE MASK PROCESS

(75) Inventors: David W. Abraham, Croton on Hudson, NY (US); Steven E. Steen, Peekskill, NY (US); Nicholas C. M. Fuller, Norh Hills, NY (US); Francois Pagette, Jefferson Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 664 days.

(21) Appl. No.: 12/028,861

(22) Filed: Feb. 11, 2008

(65) Prior Publication Data

US 2009/0202952 A1    Aug. 13, 2009

(51) Int. Cl.
*G03F 7/26* (2006.01)
(52) U.S. Cl. ........................................ 430/313; 430/314
(58) Field of Classification Search .................. 430/313, 430/323, 324
See application file for complete search history.

(56) References Cited

U.S. PATENT DOCUMENTS

| | | | |
|---|---|---|---|
| 6,063,688 A * | 5/2000 | Doyle et al. | 438/424 |
| 6,194,268 B1 | 2/2001 | Furukawa et al. | |
| 6,884,735 B1 | 4/2005 | Okoroanyanwu et al. | |
| 2006/0273456 A1 * | 12/2006 | Sant et al. | 257/734 |
| 2006/0281266 A1 * | 12/2006 | Wells | 438/299 |

* cited by examiner

*Primary Examiner* — Kathleen Duda
*Assistant Examiner* — Caleen O Sullivan
(74) *Attorney, Agent, or Firm* — Cantor Colburn LLP; Vazken Alexanian

(57) ABSTRACT

A method of implementing sub-lithographic patterning of a semiconductor device includes forming a first set of patterned features with a single lithography step, the initial set of patterned features characterized by a linewidth and spacing therebetween; forming a first set of sidewall spacers on the first set of patterned features, and thereafter removing the first set of patterned features so as to define a second set of patterned features based on the geometry of the first set of sidewall spacers; and performing one or more additional iterations of forming subsequent sets of sidewall spacers on subsequent sets of patterned features, followed by removal of the subsequent sets of patterned features, wherein a given set of patterned features is based on the geometry of an associated set of sidewall spacers formed prior thereto, and wherein a final of the subsequent sets of patterned features is characterized by a sub-lithographic dimension.

18 Claims, 5 Drawing Sheets

| Remaining Iterations (n) | Multiplier | Line | Space | Spacer n | Period |
|---|---|---|---|---|---|
| 0 | 1 | | | | |
| 1 | 2 | 1 | 1 | | 2 |
| 2 | 4 | 1 | 3 | 1 | 4 |
| 3 | 8 | 3 | 5 | 1 | 8 |
| 4 | 16 | 5 | 11 | 3 | 16 |
| 5 | 32 | 11 | 21 | 5 | 32 |
| 6 | 64 | 21 | 43 | 11 | 64 |
| 7 | 128 | 43 | 85 | 21 | 128 |
| 8 | 256 | 85 | 171 | 43 | 256 |
| 9 | 512 | 171 | 341 | 85 | 512 |
| 10 | 1024 | 341 | 683 | 171 | 1024 |
| 11 | 2048 | 683 | 1365 | 341 | 2048 |
| 12 | 4096 | 1365 | 2731 | 683 | 4096 |
| 13 | 8192 | 2731 | 5461 | 1365 | 8192 |
| 14 | 16384 | 5461 | 10923 | 2731 | 16384 |
| 15 | 32768 | 10923 | 21845 | 5461 | 32768 |
| 16 | 65536 | 21845 | 43691 | 10923 | 65536 |
| 17 | 131072 | 43691 | 87381 | 21845 | 131072 |
| 18 | 262144 | 87381 | 174763 | 43691 | 262144 |
| 19 | 524288 | 174763 | 349525 | 87381 | 524288 |
| 20 | 1048576 | 349525 | 699051 | 174763 | 1048576 |
| 21 | 2097152 | 699051 | 1398101 | 349525 | 2097152 |
| | | 1398101 | 2796203 | 699051 | 4194304 |

SUBLITHOGRAPHIC PATTERNING METHOD INCORPORATING A SELF-ALIGNED SINGLE MASK PROCESS

BACKGROUND

The present invention relates generally to semiconductor device processing techniques and, more particularly, to a sub-lithographic patterning method incorporating a self-aligned, single mask process.

Lithography is one of the most important techniques utilized in semiconductor manufacturing, and is particularly used to define patterns, such as those employed in a wiring layer patterning process or a doped-region defining process for example. A lithography process generally includes an exposure step and a development step, wherein the exposure step utilizes a light source to irradiate a photoresist layer directly or through a photomask to induce chemical reactions in exposed portions. The development step is conducted to remove the exposed portion in positive resist (or the unexposed portion in negative resist) and form photoresist patterns, thus completing the transfer of photomask patterns or virtual patterns to the resist material.

With lithography pushing to the theoretical limits of resolution, the use of double exposure is beginning to play a more important role. Techniques such as dipole decomposition can allow the lithographer to print features that would not be possible with a single exposure. Many of these techniques require an intermediate etch step into a hard mask material. However, the hardmask materials can have integration issues because they can interact with the substrate underneath. In addition, because the hardmask is deposited directly on the substrate, the intermediate etches can cause damage to the substrate itself. Opening the hardmask can also expose the substrate to chemicals and/or materials that adversely affect the substrate.

Alternatively, other non-conventional approaches, such as e-beam lithography and X-ray lithography, suffer the drawbacks of low throughput and immaturity for manufacturing. On the other hand, a simple sidewall spacer imaging technique transferred to a layer below allows for the formation of features narrower than the minimal size, F, that can be printed by conventional lithography, but the resulting structure is still limited by lithography capabilities, in that narrow structures spaced by lithographically defined dimensions. That is, the spacing between individual structures is not also reduced below the minimum feature size so as to allow for increased feature density.

Accordingly, it would be desirable to be able to enhance the resolution of lithographically patterned features in a manner that overcomes the above mentioned drawbacks.

SUMMARY

The foregoing discussed drawbacks and deficiencies of the prior art are overcome or alleviated, in an exemplary embodiment, by a method of implementing sub-lithographic patterning of a semiconductor device feature, including forming a first set of patterned features with a single lithography step, the initial set of patterned features characterized by a linewidth and spacing therebetween; forming a first set of sidewall spacers on the first set of patterned features, and thereafter removing the first set of patterned features so as to define a second set of patterned features based on the geometry of the first set of sidewall spacers; and performing one or more additional iterations of forming subsequent sets of sidewall spacers on subsequent sets of patterned features, followed by removal of the subsequent sets of patterned features, wherein a given set of patterned features is based on the geometry of an associated set of sidewall spacers formed prior thereto; wherein a final of the subsequent sets of patterned features following the one or more subsequent iterations are characterized by a sub-lithographic dimension with respect to equipment used in the single lithography step.

In another embodiment, a method of implementing sub-lithographic patterning of a semiconductor device feature includes selecting a sub-lithographic feature size, F, for a structure to be formed on a semiconductor substrate; selecting a number, n, of sidewall spacer iterations to be performed in achieving the selected sub-lithographic feature size F; forming a first set of patterned features with a single lithography step, the initial set of patterned features characterized by a linewidth and spacing therebetween; implementing a first of the n sidewall spacer iterations by forming a first set of sidewall spacers on the first set of patterned features, and thereafter removing the first set of patterned features so as to define a second set of patterned features based on the geometry of the first set of sidewall spacers; and performing the remaining n−1 iterations of forming one or more subsequent sets of sidewall spacers on subsequent sets of patterned features, followed by removal of the subsequent sets of patterned features, wherein a given set of patterned features is based on the geometry of an associated set of sidewall spacers formed prior thereto; wherein a final of the subsequent sets of patterned features following completion of the n sidewall spacer iterations has the selected sub-lithographic dimension F.

BRIEF DESCRIPTION OF THE DRAWINGS

Referring to the exemplary drawings wherein like elements are numbered alike in the several Figures:

FIG. 2 is a table illustrating geometric spacing relationships between spacer (line) widths and spacing therebetween used to produce a plurality of patterned sub-lithographic features of a desired feature size, F, with the same spacing F between features, given specific number of patterning iterations used in the process, in accordance with a further embodiment of the invention.

DETAILED DESCRIPTION

Disclosed herein is an iterative, sub-lithographic patterning method incorporating a self-aligned, single mask process in lithography. Briefly stated, the embodiments herein utilize the formation of sidewall spacers on an initial structure (e.g., a patterned photoresist layer within conventional lithography capability), and thereafter using the sidewall spacers as etch masks in subsequent steps. Moreover, many such iterations of sidewall spacer growth and subsequent pattern etch/transfer allows for the formation of lithography resolution independent, high-resolution line and space grating patterns, with each iteration of the process resulting in a further resolution doubling. In addition, the disclosed method embodiments allow for creation of not only small features, but also spaces them apart by equally small dimensions.

Figure 1A:
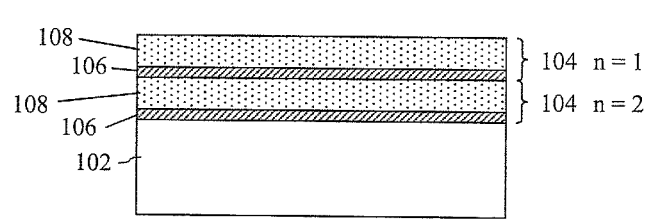
FIGS. 1(a) through 1(k) are a series of cross sectional views illustrating an exemplary process flow for implementing an iterative, sub-lithographic patterning method in accordance with an embodiment of the invention.

Referring initially to FIGS. 1(a) through 1(k), there is shown a series of cross sectional views illustrating an exemplary process flow for implementing the iterative, sub-lithographic patterning method in accordance with an embodiment of the invention. In this exemplary sequence, a 4× (2 iteration) reduction of an initially patterned feature size and periodicity is depicted, although it will be understood that the process is applicable to a different number, n, of iterations wherein the resulting feature reduction is 2n. As shown in FIG. 1(a), a semiconductor substrate 102 (e.g., silicon, silicon germanium, silicon-on-insulator, etc.) has a pair of layer stacks formed thereon, the stacks generally depicted by 104. Each stack 104 includes, for example, a low-temperature oxide (LTO) layer 106 and a polysilicon layer 108 formed atop the LTO layer 106. The LTO layer 106 may have an exemplary thickness on the order of about 50 nanometers (nm) and the polysilicon layer 108 may have an exemplary thickness of about 100 (nm).

Figure 1C:
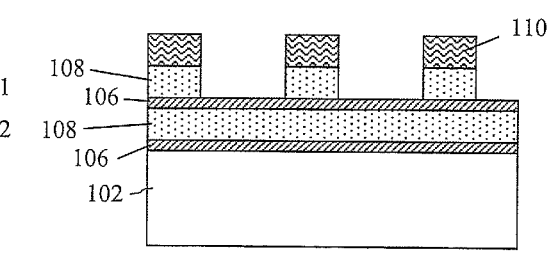
Figure 1B:
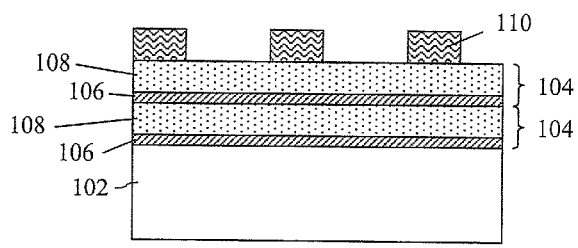
Figure 1D:
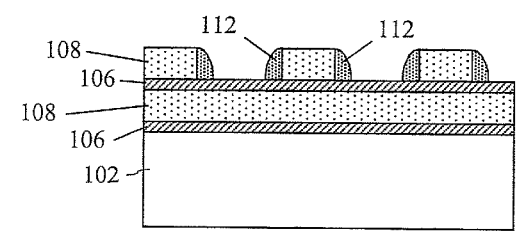

Again, in the specific example depicted, a 4× periodicity reduction using 2 iterative sidewall formation and pattern transfer operations results in the use of 2 layer stacks 104, the uppermost stack used in the first iteration (n=1) and the lowermost stack used in the second iteration (n=2). As then shown in FIG. 1(b), a photoresist layer 110 is exposed to form an initial pattern within the capabilities of conventional lithography equipment. The initial pattern is then transferred into the polysilicon layer 108 of the top stack 104, using the LTO layer 106 as an etch stop, as shown in FIG. 1(c). The etch chemistry in removing portions of the polysilicon layer 108 selective to oxide may include, for example an ($HBr/Cl_2/O_2$) chemistry followed by a resist strip (e.g., $O_2/N_2$). Once the resist layer 110 is stripped, a spacer material (e.g., a nitride) is conformally deposited such as by rapid thermal chemical vapor deposition (RTCVD) and thereafter etched back to form a first set of sidewall spacers 112 as shown in FIG. 1(d). A suitable nitride (e.g., SiN) spacer etch chemistry, selective to polysilicon, may be used to remove the excess spacer material (e.g., $CH_3F/O_2$).

Figure 1E:
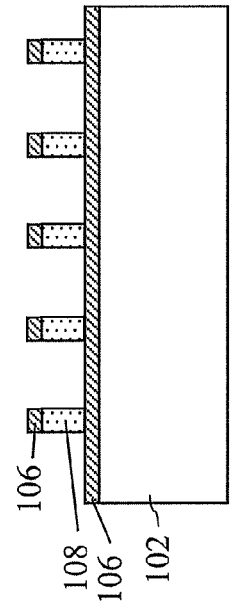
Figure 1F:
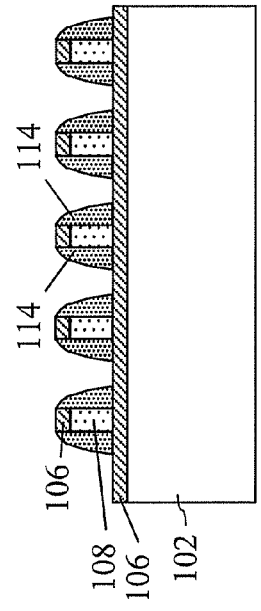

Proceeding to FIG. 1(e), the initial polysilicon pattern formed from the resist layer is removed, leaving only the first set of spacers 112 on the LTO layer 106. To accomplish this, a non-standard polysilicon etch chemistry may be utilized (e.g., $HBr/Cl_2/O_2$) that is selective to both the LTO layer 106 and the SiN spacers 112. Then, as shown in FIG. 1(f), the resulting pattern defined by the first set of spacers 112 is transferred through the LTO layer 106 of the original uppermost stack 104, and thereafter into the polysilicon layer 108 of the original lowermost stack 104. To remove the LTO layer 106, another non-standard etch chemistry may be used (e.g., $C_4F_8, C_4F_6$) that is selective to the SiN spacers 112. In addition, to remove the polysilicon layer 108, still another non-standard etch chemistry may be used (e.g., $HBr/Cl_2/O_2$) that is selective to both the LTO layer 106 and the SiN spacers 112.

Figure 1G:
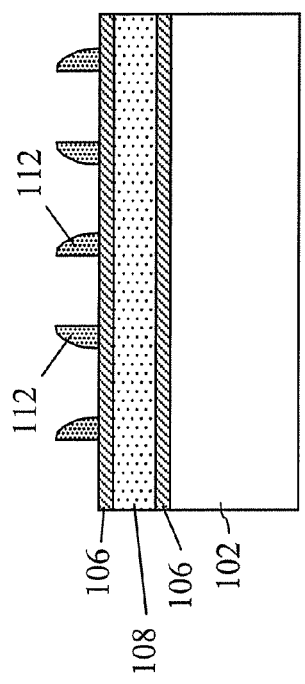
Figure 1H:
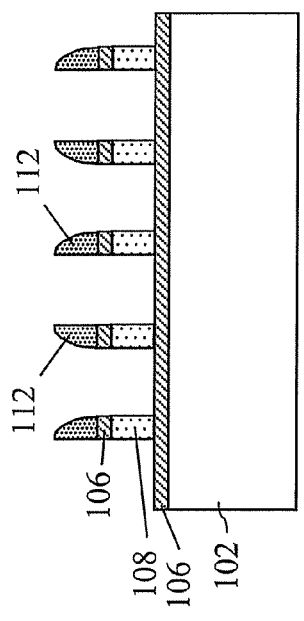

As then shown in FIG. 1(g), any remaining nitride material from the first set of spacers 112 may be removed, such as through a phosphoric acid etch selective to oxide and exposed polysilicon. A suitable non-standard etch chemistry in this regard may be, for example, $CH_3F/O_2$. Proceeding to FIG. 1(h), the second iteration of spacer pattern formation is implemented by nitride material deposition and subsequent etch (in a similar manner as described above) so as to result in a second of spacers 114. It will be noted that the second set of spacers 114 has a smaller spacing therebetween with respect to the first set of spacers 112. Specific geometric relationships between iteratively formed sets of spacers are discussed in further detail below.

Figure 1K:
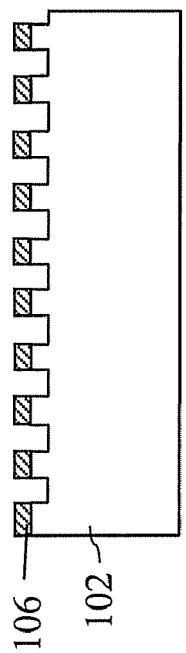
Figure 1I:
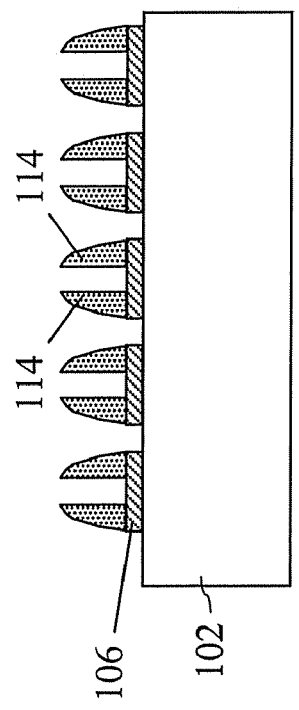
Figure 1J:
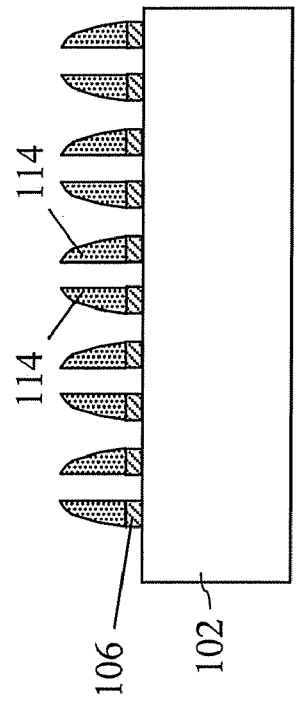

In FIG. 1(i), the exposed portions of the LTO layer 106 are removed, followed by the polysilicon material 108 in a similar as described above for the first iteration. In FIG. 1(j), the remaining exposed portions of the LTO layer 106 are removed after the polysilicon removal so as to define the final sub-lithographic pattern, which is then transferred into the substrate 102 as shown in FIG. 1(k). The remaining spacer material from the second set of spacers 114 may also be removed at this point (as described above) in preparation for further device processing.

Referring now to FIG. 2, there is shown a table 200 illustrating geometric spacing relationships between spacer (line) widths and spacing therebetween used to produce a plurality of patterned sub-lithographic features of a desired feature size, F, with the same spacing F between features, given specific number of patterning iterations used in the process, in accordance with a further embodiment of the invention. The first column of table 200 "Remaining Iterations (n)" represents the number of remaining sidewall spacer iterations, n, to be performed in the process. Based on the number of iterations, n, initially selected there will be a final reduction in the period of the initially patterned feature by a factor of $2^n$. This is reflected in the second column of table 200, labeled "Multiplier", which refers to the multiple by which the period of the initial feature is reduced after n spacer iterations are performed. By way of example, if four (4) spacer iterations are performed (i.e., n=4), then the period of the final patterned features will reduced by a factor of $2^4$ or 16 with respect to the period of the patterned features on which the first set of spacers are formed.

The third column of table 200 "Line" reflects, for a given number of spacer iterations remaining to be performed in the process, the relative size of the starting pattern needed in order to create sub-lithographic features of size F having a space of F therebetween. Using the above example for a 4-iteration process, then the initially formed feature (e.g., a patterned resist layer or hardmask) has a linewidth of 11 times the target sub-lithographic feature size F. In addition, the fourth column of table 200 "Space" represents the distance between the initially patterned features. Thus, for a 4-iteration process, the distance between features of size 11F is 21F.

The fifth column of table 200 "Spacer n" reflects the width of the spacer to be formed given the line size and the space size. For example, for a 4-iteration process, where features of size 11F each spaced apart by a distance of 21F, the first set of spacers formed in the process are designed to be 5F in width. Finally, the last column of table 200 "Period" simply reflects the periodicity between the patterned features (i.e., the feature size plus the spacing therebetween).

It should be noted from table 200 that when a specific number of iterations are chosen to form a feature of size F and spaced part by F, the initial line and spacing is determined by the row according to the number of remaining iterations, n, to be performed and working upward for each successive iteration left. Continuing with the 4-iteration example, it is assumed that the desired final feature size is 10 nanometers (nm), with a spacing of 10 nm between the features. Accordingly, where four spacer formation iterations are to be used in the process, it will be seen from table 200 that an initial pattern is formed such that the features size is 11F or 110 nm, with a spacing of 21F or 210 nm therebetween. Further, the spacer process (e.g., as described in FIG. 1 above) is tuned such that the first set of sidewall spacers is 5F or 50 nm in width. After formation of the first set of spacers, and removal of the initially patterned features (of 110 nm in width), the first set of spacers defines the new pattern on which the next set of sidewall spacers are to be formed. According to table 200 (moving upward to n=3), the linewidth is now 5F with a spacing of 11F therebetween. Now, the second set of spacers is formed so as to be 3F in width (i.e., 30 nm) with a spacing of 5F therebetween. On the third iteration, the spacers are now formed at F (10 nm), the feature size, with a spacing of 3F therebetween. Finally, for the last iteration, the spacers are again formed at a width F, but this time the spacing therebetween is also F. This last pattern may then be transferred into the desired layer (e.g., a semiconductor substrate).

The geometric information depicted in table 200 is derived using the following expressions for remaining iterations, n, so long as n>0, and assuming that the final conditions are defined to be no iterations remaining (n=0) such that the final linewidth is 1 (1F), the spacing therebetween is 1, and thus the period of the final pattern is 2 (1+1):

Period(n)=2*Period(n−1);

Line(n)=Space(n−1);

Space(n)=[2*Period(n−1)]−[Space(n−1)];

Spacer(n)=Line(n−1).

Thus, for one (1) iteration remaining, the table data is computed as follows:

Period(1)=2*Period(0)=2*2=4;

Line(1)=Space(0)=1;

Space(1)=[2*Period(0)]−Space(0)=4−1=3; and

Spacer(1)=Line(n−1)=1.

For two (2) iterations remaining, the table data is computed as follows:

Period(2)=2*Period(1)=2*4=8;

Line(2)=Space(1)=3;

Space(2)=[2*Period(1)]−Space(1)=8−3=5; and

Spacer(2)=Line(1)=1.

For two (3) iterations remaining, the table data is computed as follows:

Period(3)=2*Period(2)=2*8=16;

Line(3)=Space(2)=5;

Space(3)=[2*Period(2)]−Space(2)=16−5=11; and

Spacer(3)=Line(2)=3.

It will thus be seen that this computational process can be repeated an infinite number of times to yield starting pattern data when it is desired to do repeated iterations until a final pattern is achieved with a line/space period of 2. As a practical matter, however, it is likely that the quality of the patterns will be reduced after more than a few iterations.

Figure 3:
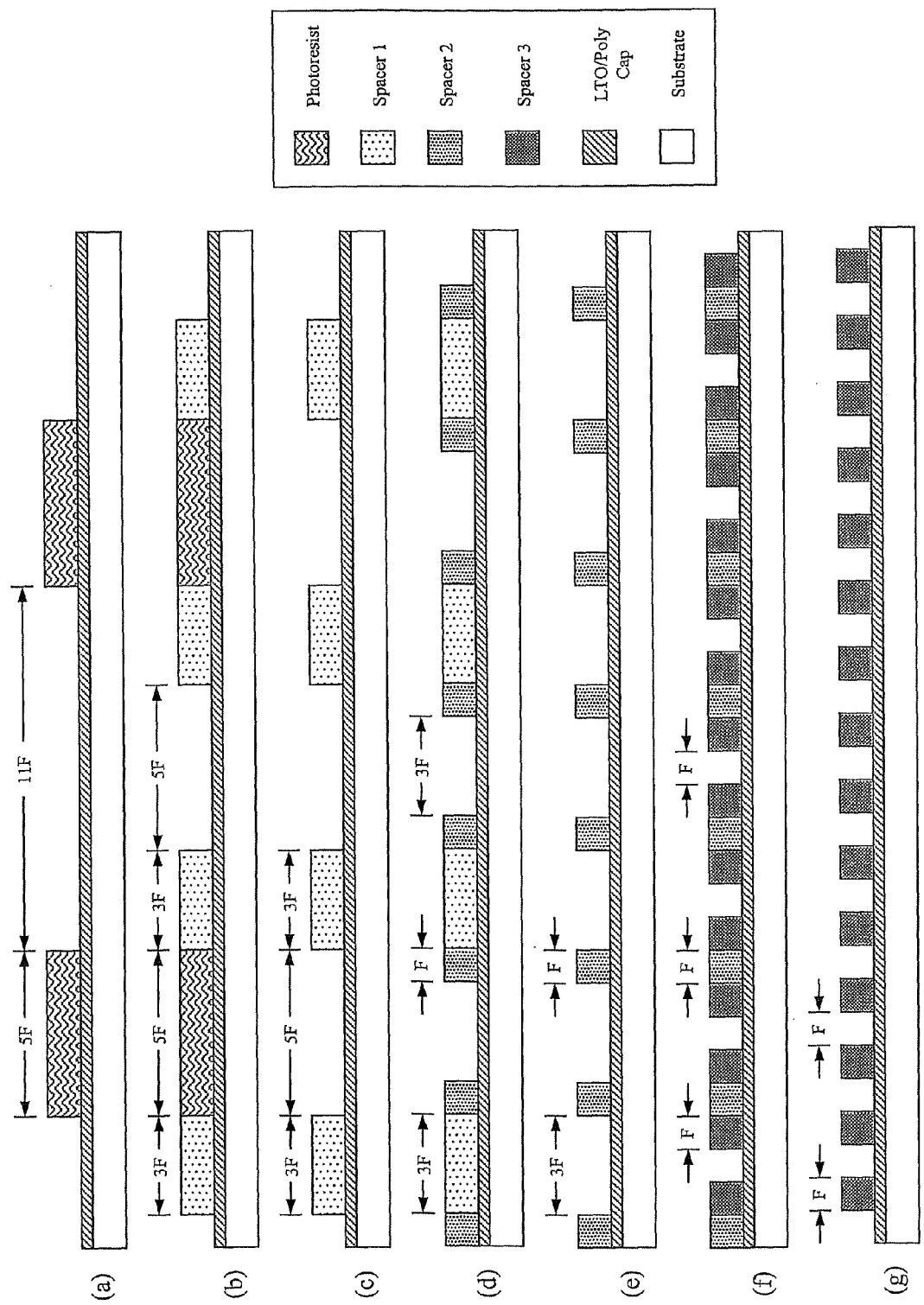
FIG. 3 illustrates an example of the geometric sequence of multiple spacer formation iterations according to the table of FIG. 2.

In order to better visualize the iterative process defined in table 200 as determined by the expressions above, FIG. 3 schematically illustrates another example by which a final sub-lithographic size F with spacing F may be formed using a single mask step. In this example, a 3-iteration process is used. From table 200, it will again be seen that the initial patterned feature size corresponds to the information given row n=3. That is, the initial patterned feature size (e.g., a resist layer) is 5F in width, and spaced apart by 11F, as particularly shown in step (a) of FIG. 3.

It should also be appreciated at this point that the example of FIG. 3 omits certain processing details as discussed in conjunction with FIG. 1, and is only intended to illustrate the geometric relationship between patterned features and spacing therebetween during the iterative process. In any event, step (b) of FIG. 3 shows the formation of the first set of spacers (Spacer 1) on sidewalls of the 5F resist. Again, from table 200, Spacer 1 has a linewidth of 3F. Once the resist pattern is removed in step (c) of FIG. 3, it will be seen that the remaining first set of spacers (of width 3F) accordingly has a spacing of 5F therebetween. It will be further noted that this configuration now corresponds to the information in the n=2 row of table 200.

As next shown in step (d) of FIG. 3, a second set of spacers (Spacer 2) is now formed on sidewalls of the pattern defined by the first set of spacers. According to the table 200, Spacer 2 has a linewidth of F. When the pattern defined by the first set of spacers is removed, the distance between each Spacer 2 is 3F, as shown in step (e) of FIG. 3. For third and final iteration to be performed, a third set of spacers (Spacer 2) is formed on sidewalls of the pattern defined by the second set of spacers, as shown in step (f) of FIG. 3. As reflected in table 200, Spacer 3 also has a linewidth of F. However, as finally shown in step (g) of FIG. 3, when the pattern defined by the second set of spacers is removed, the distance between each Spacer 3 (of width F) is now also F.

Accordingly, by selecting an initial feature size within the capabilities of conventional lithography, it is possible to define an initial pattern with a single mask step and then use iterative sidewall spacer formation to create subsequently smaller patterns defined by the spacer thickness. Where desired, a repetitive pattern of sub-lithographic features and equivalent spacing can be created using the geometries defined in table 200, although it will be appreciated that any of intermediate patterns may be a final result by themselves.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of implementing sub-lithographic patterning of a semiconductor device feature, the method comprising:

forming a first set of patterned features with a single lithography step, the initial set of patterned features characterized by a linewidth and spacing therebetween;

forming a first set of sidewall spacers on the first set of patterned features, and thereafter removing the first set of patterned features so as to define a second set of patterned features based on the geometry of the first set of sidewall spacers;

performing one or more additional iterations of forming subsequent sets of sidewall spacers on subsequent sets of patterned features, followed by removal of the subsequent sets of patterned features, wherein a given set of patterned features is based on the geometry of an associated set of sidewall spacers formed prior thereto;

wherein a final of the subsequent sets of patterned features following the one or more subsequent iterations are characterized by a sub-lithographic dimension with respect to equipment used in the single lithography step; and for each iteration of sidewall spacer formation, forming an associated layer stack over a semiconductor substrate prior to the single lithography step;

each layer stack comprising a first layer of a first material and a second layer of a second material, with a photoresist layer initially formed over a topmost layer stack.

2. The method of claim 1, wherein the final set of patterned features has a sub-lithographic feature size, F, and a spacing between adjacent features of F such that a period of the final set of patterned features is 2F.

3. The method of claim 2, wherein for given a number of remaining iterations, n, out of the total number of sidewall spacer formation iterations performed, the linewidth and spacing therebetween of a corresponding set of previously formed patterned features is determined in accordance with the following:

$$Period(n)=2*Period(n-1);$$

$$Line(n)=Space(n-1);$$

$$Space(n)=[2*Period(n-1)]-[Space(n-1)];$$

$$Spacer(n)=Line(n-1);$$

wherein Period is the period of a given set of patterned features with n remaining iterations, Line is the linewidth of a given set of patterned features with n remaining iterations, Space is the is distance between a pair of patterned features in given set of patterned features with n remaining iterations, and Spacer is the thickness of a given set of sidewall spacers to be formed on the patterned features with n remaining iterations; and wherein, for the final set of patterned features with no remaining iterations n=0, Period=2, Line=1, Spacer=1 and Spacer=1, with respect to a multiple of the sub-lithographic feature size, F.

4. The method of claim 1, wherein the one or more additional iterations of subsequent sets of sidewall spacers are formed on the second layer of the layer stack.

5. The method of claim 4, wherein the first material comprises an oxide and the second material comprises polysilicon.

6. The method of claim 5, wherein the sidewall spacers comprise a nitride material.

7. The method of claim 1, further comprising implementing one additional iteration of forming subsequent sets of sidewall spacers so as to perform a total of two sidewall spacer formation iterations, thereby reducing a period of the initial set of patterned features by a factor of 4.

8. The method of claim 1, further comprising implementing two additional iterations of forming subsequent sets of sidewall spacers so as to perform a total of three sidewall spacer formation iterations, thereby reducing a period of the initial set of patterned features by a factor of 8.

9. The method of claim 1, further comprising implementing three additional iterations of forming subsequent sets of sidewall spacers so as to perform a total of four sidewall spacer formation iterations, thereby reducing a period of the initial set of patterned features by a factor of 16.

10. A method of implementing sub-lithographic patterning of a semiconductor device feature, the method comprising:
  selecting a sub-lithographic feature size, F, for a structure to be formed on a semiconductor substrate;
  selecting a number, n, of sidewall spacer iterations to be performed in achieving the selected sub-lithographic feature size F;
  forming a first set of patterned features with a single lithography step, the initial set of patterned features characterized by a linewidth and spacing therebetween;
  implementing a first of the n sidewall spacer iterations by forming a first set of sidewall spacers on the first set of patterned features, and thereafter removing the first set of patterned features so as to define a second set of patterned features based on the geometry of the first set of sidewall spacers;
  performing the remaining n−1 iterations of forming one or more subsequent sets of sidewall spacers on subsequent sets of patterned features, followed by removal of the subsequent sets of patterned features, wherein a given set of patterned features is based on the geometry of an associated set of sidewall spacers formed prior thereto;
  wherein a final of the subsequent sets of patterned features following completion of the n sidewall spacer iterations has the selected sub-lithographic dimension F; and
  for each iteration of sidewall spacer formation, forming an associated layer stack over a semiconductor substrate prior to the single lithography step;
  each layer stack comprising a first layer of a first material and a second layer of a second material, with a photoresist layer initially formed over a topmost layer stack.

11. The method of claim 10, wherein, in addition to the final set of patterned features having the sub-lithographic feature size, F, a spacing between adjacent features is also F such that a period of the final set of patterned features is 2F.

12. The method of claim 11, wherein for given a number of remaining iterations, n, out of the total number of sidewall spacer formation iterations performed, the linewidth and spacing therebetween of a corresponding set of previously formed patterned features is determined in accordance with the following:

$$Period(n)=2*Period(n-1);$$

$$Line(n)=Space(n-1);$$

$$Space(n)=[2*Period(n-1)]-[Space(n-1)];$$

$$Spacer(n)=Line(n-1);$$

wherein Period is the period of a given set of patterned features with n remaining iterations, Line is the linewidth of a given set of patterned features with n remaining iterations, Space is the is distance between a pair of patterned features in given set of patterned features with n remaining iterations, and Spacer is the thickness of a given set of sidewall spacers to be formed on the patterned features with n remaining iterations; and wherein, for the final set of patterned features with no remaining iterations n=0, Period=2, Line=1, Spacer=1 and Spacer=1, with respect to a multiple of the sub-lithographic feature size, F.

13. The method of claim 10, wherein the one or more additional iterations of subsequent sets of sidewall spacers are formed on the second layer of the layer stack.

14. The method of claim 13, wherein the first material comprises an oxide and the second material comprises polysilicon.

15. The method of claim 14, wherein the sidewall spacers comprise a nitride material.

16. The method of claim 10, further comprising implementing a total of two sidewall spacer formation iterations, thereby reducing a period of the initial set of patterned features by a factor of 4.

17. The method of claim 10, further comprising implementing a total of three sidewall spacer formation iterations, thereby reducing a period of the initial set of patterned features by a factor of 8.

18. The method of claim 10, further comprising implementing a total of four sidewall spacer formation iterations, thereby reducing a period of the initial set of patterned features by a factor of 16.

* * * * *